US006184749B1

(12) United States Patent
Hsiao

(10) Patent No.: US 6,184,749 B1
(45) Date of Patent: Feb. 6, 2001

(54) LAYOUT FOR PULL-UP/PULL-DOWN DEVICES OF OFF-CHIP DRIVER

(75) Inventor: Tzu-Che Hsiao, Hsinchu (TW)

(73) Assignee: Vanguard International Semiconductor Corp., Hsinchu (TW)

( * ) Notice: Under 35 U.S.C. 154(b), the term of this patent shall be extended for 0 days.

(21) Appl. No.: 09/422,022

(22) Filed: Oct. 20, 1999

(51) Int. Cl.[7] .................................................... H01L 25/00

(52) U.S. Cl. ........................................... 327/565; 327/112

(58) Field of Search .................................... 327/112, 564, 327/565, 566

(56) References Cited

U.S. PATENT DOCUMENTS 5,561,384 * 10/1996 Reents et al. ........................ 327/108

5,751,180 * 5/1998 D'Addeo .............................. 327/379

* cited by examiner

*Primary Examiner*—Jeffrey Zweizig

(74) *Attorney, Agent, or Firm*—J.C. Patents; Jiawei Huang

(57) ABSTRACT

A type of wiring layout for pull-up and pull-down devices of an off-chip driver. This type of wiring layout is simpler and does not require the reservation of wiring space between neighboring bonding pads. Hence, layout area can be greatly reduced. In addition, even when the distance of separation between the pull-up device or the pull-down device and the bonding pad is great, no additional layout area is needed. Since the length of conductive wires for connecting to the pull-up or pull-down devices is much shorter, signal transmission speed is also increased.

4 Claims, 2 Drawing Sheets

144 142 132 134 123 122 153 152 111 112 121 124 151 154 131 133 141 143 ative device

LAYOUT FOR PULL-UP/PULL-DOWN DEVICES OF OFF-CHIP DRIVER

BACKGROUND OF THE INVENTION

1. Field of the Invention

The present invention relates to the wiring layout of an integrated circuit. More particularly, the present invention relates to the wiring layout for the pull-up and pull-down devices of an off-chip driver.

2. Description of the Related Art

Due to the rapid increase in the level of integration, compact and lightweight electronic products have emerged. To catch up with these highly functional products, the layout of a chip carrier for supporting a silicon chip in a package and the layout of a printed circuit board (PCB) for assembling electronic components and other circuit boards have been improved. Because the pin-counts of electronic devices increase with the level of integration, the number of bonding pads on a circuit board must increase correspondingly. Consequently, density of wires on a circuit board must also increase. In addition, due to the high-density layout and miniaturization of signaling lines, distance of separation between neighboring bonding pads must be greatly reduced as well.

FIG. 1 is the layout and wiring connections of pull-up and pull-down devices in a conventional off-chip driver (OCD).

The off-chip driver (OCD) as shown in FIG. 1 includes bonding pads 11 and 12, pull-up drivers 21 and 22, pull-down drivers 23 and 24, pull-up signaling lines 31 and 32 and pull-down signaling lines 33 and 34. The pull-up driver 21 and the pull-down driver 23 provide pull-up voltage and pull-down voltage to the bonding pad 11, respectively. Similarly, the pull-up driver 22 and the pull-down driver 24 provide pull-up voltage and pull-down voltage to the bonding pad 12, respectively. The pull-up driver 21 and the pull-down driver 23 are located on opposite sides (for example, the upper and lower sides as shown in FIG. 1) of the bonding pad 11. The pull-up driver 22 and the pull-down driver 24 are also located on the upper and lower sides of the bonding pad 12, respectively. In other words, both pull-up drivers 21 and 22 are on the same side above the bonding pads 11 and 12 while both pull-down drivers 23 and 24 are on the same side below the bonding pads 11 and 12.

The pull-up signal lines 31 and 32 are connected to the pull-up driver 21 and the pull-up driver 22 through conductive lines 41 and 42, respectively. Hence, a pull-up voltage is provided to each active device 51 inside the pull-up driver 21 and each active device 52 inside the pull-up driver 22. The active devices 51 and 52 are metal-oxide-semiconductor (MOS) transistors, for example. Note that the conductive line 41 branches off from the pull-up signal line 31, runs along the side of the pull-down driver 23, the bonding pad 11 and the pull-up driver 21 and finally enters the pull-up driver 21. The conductive line 42 branches off from the pull-up signal line 32, runs along the side of the pull-up driver 22 and finally enters the pull-up driver 22. The pull-down signal lines 33 and 34 are connected to the pull-down driver 23 and the pull-down driver 24 through conductive lines 43 and 44, respectively. Hence, a pull-down voltage is provided to each active device 53 inside the pull-down driver 23 and each active device 54 inside the pull-down driver 24. Note that the conductive line 44 branches off from the pull-down signal line 34, runs along the side of the pull-up driver 22, the bonding pad 12 and the pull-down driver 24 and finally enters the pull-down driver 24. The conductive line 43 branches off from the pull-up signal line 33, runs along the side of the pull-down driver 23 and finally enters the pull-down driver 23.

The number of bonding pads is not restricted to just two. Obviously, for more than two bonding pads, the increase in the number of pull-up drivers is equal to the number of pull-down drivers.

However, as the number of bonding pads increases, extra space must be set aside for laying the pull-up and pull-down conductive lines for connection with the pull-up and pull-down drivers. Hence, overall layout area will increase.

In addition, as the distance of separation between a pull-up driver or a pull-down driver and bonding pad increases, overall length of the conductive lines leading into the pull-up driver or the pull-down driver also increases. Hence, signal transmission time increases.

Furthermore, as the level of integration of integrated circuits continues to decrease, not only do the dimensions of each electronic device decrease, but area for laying conductive lines shrink as well. Consequently, how to reduce the area necessary for laying connection lines is an important issue in the semiconductor industry.

SUMMARY OF THE INVENTION

Accordingly, one object of the present invention is to provide a layout for the pull-up and pull-down devices of an off-chip driver so that the area necessary for laying the connection lines can be reduced.

To achieve these and other advantages and in accordance with the purpose of the invention, as embodied and broadly described herein, the invention provides a layout of the pull-up and pull-down devices in an off-chip driver. The off-chip driver includes a first and a second bonding pads, a first and a second pull-up driver, a first and a second pull-down driver, a first and a second pull-up signal line, and a first and a second pull-down signal line. The second bonding pad is placed next to the first bonding pad. The first pull-up driver is formed below the first bonding pad for providing a first pull-up voltage to the first bonding pad. The first pull-down driver is formed on the right side of the first pull-up driver for providing a first pull-down voltage to the first bonding pad. The second pull-up driver is formed above the second bonding pad for providing a second pull-up voltage to the second bonding pad. The second pull-down driver is formed on the left side of the second pull-up driver for providing a second pull-down voltage to the second bonding pad. The first pull-up conductive line branches from the first pull-up signal line just below the first pull-up driver and enters the first pull-up driver. The first pull-up signal line provides a first pull-up voltage to the active devices inside the first pull-up driver so that the first pull-up driver is driven to a first high potential level. The first pull-down conductive line branches from the first pull-down signal line just below the first pull-down driver and enters the first pull-down driver. The first pull-down signal line provides a first pull-down voltage to the active devices inside the first pull-down driver so that the first pull-down driver is pulled down to a first low potential level. The second pull-up conductive line branches from the second pull-up signal line just above the second pull-up driver and enters the second pull-up driver. The second pull-up signal line provides a second pull-up voltage to the active devices inside the second pull-up driver so that the second pull-up driver is driven to a second high potential level. The second pull-down conductive line branches from the second pull-down signal line just above the second pull-down driver and enters the second pull-down driver. The second pull-down signal line provides a second pull-down voltage to the active devices inside the second pull-down driver so that the second pull-down driver is pulled down to a second low potential level. The first pull-up driver and the first pull-down driver can interchange positions. The same applies to the second pull-up driver and the second pull-down driver.

The layout of pull-up and pull-down devices in an off-chip driver according to this invention is capable not only of simplifying the layout, but also of reducing the layout area. Moreover, even when the distance of separation between the pull-up driver and the pull-down driver from their respective bonding pads is large, additional layout area is unnecessary. In addition, since the layout method can shorten overall length of conductive lines, signal transmission speed is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
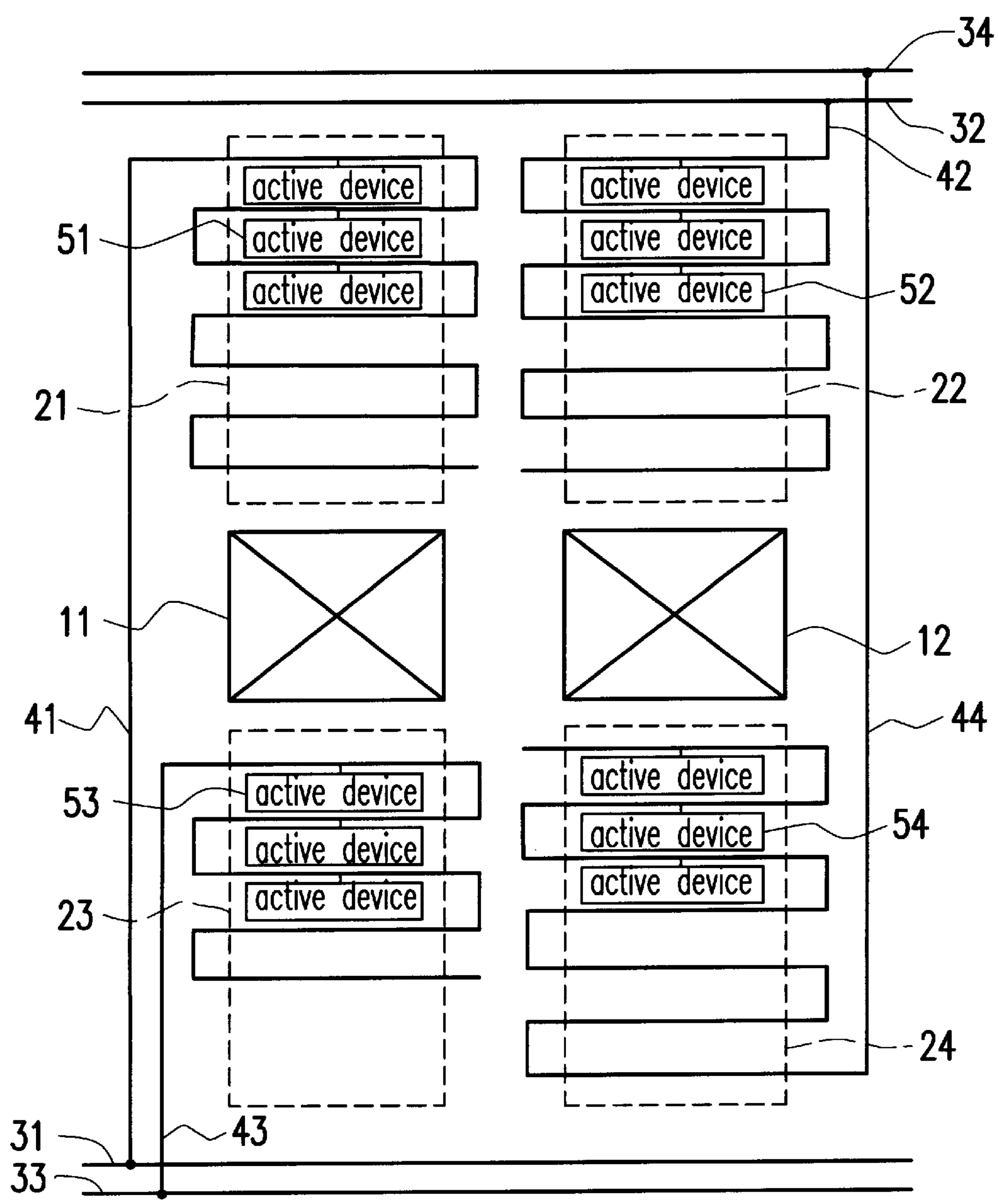
FIG. 1 is the layout and wiring connections of pull-up and pull-down devices in a conventional off-chip driver (OCD)

Reference will now be made in detail to the present preferred embodiments of the invention, examples of which are illustrated in the accompanying drawings. Wherever possible, the same reference numbers are used in the drawings and the description to refer to the same or like parts.

Figure 2:
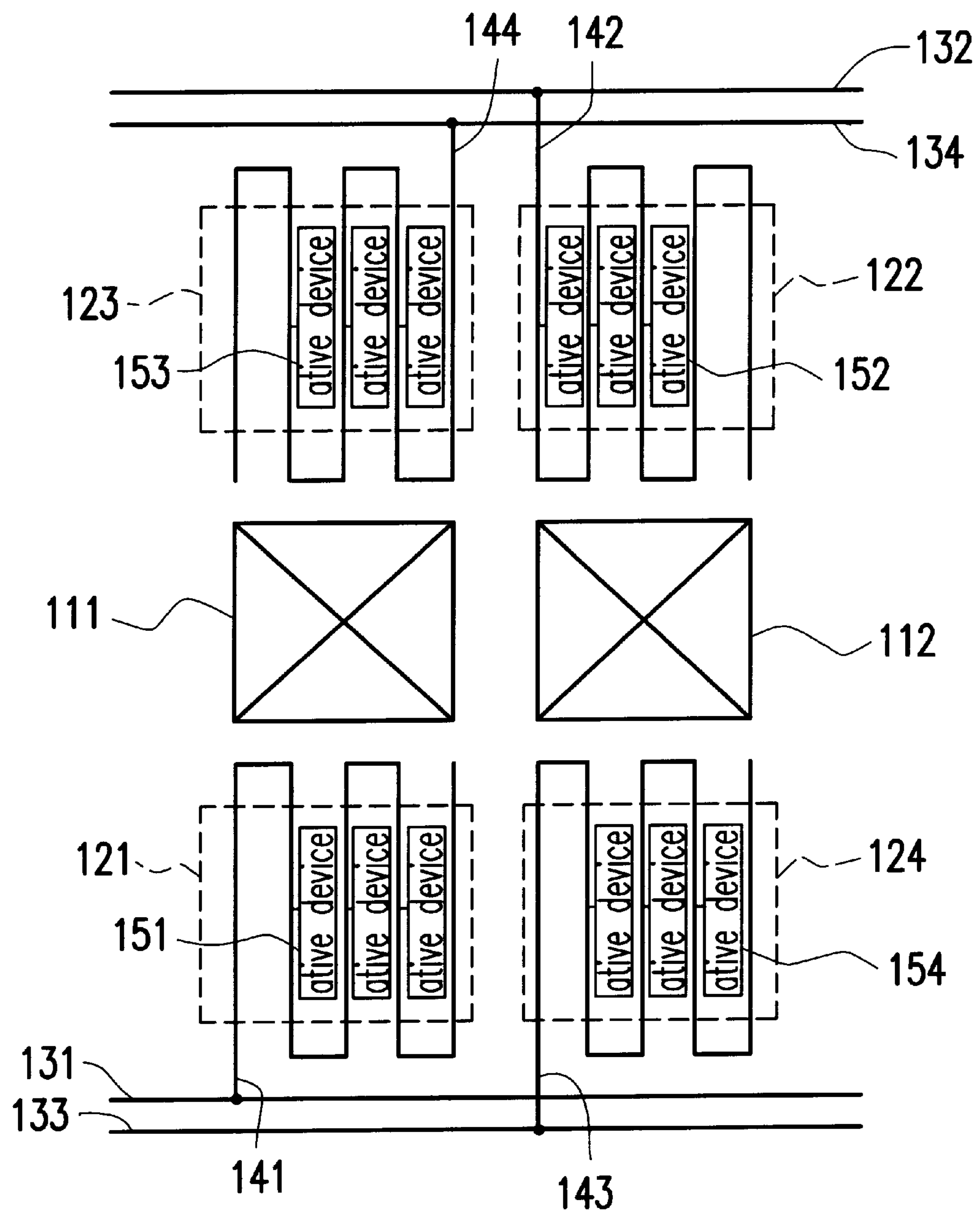
FIG. 2 is the layout and wiring connections of pull-up and pull-down devices in an off-chip driver according to one preferred embodiment of this invention.

FIG. 2 is the layout and wiring connections of pull-up and pull-down devices in an off-chip driver according to one preferred embodiment of this invention.

As shown in FIG. 2, the layout 110 of pull-up and pull-down devices in the off-chip driver of this invention is very similar to the layout shown in FIG. 1. The off-chip driver includes bonding pads 111 and 112, pull-up drivers 121 and 122, pull-down drivers 123 and 124, pull-up signal lines 131 and 132, and pull-down signal lines 133 and 134. The pull-up driver 121 provides a pull-up voltage and the pull-down driver 124 provides a pull-down voltage to the bonding pad 111. Similarly, the pull-up driver 122 provides a pull-up voltage and the pull-down driver 123 provides a pull-down voltage to the bonding pad 112.

The pull-up driver 121 is formed below the bonding pad 111. The pull-down driver 124 is formed on the right side of the pull-up driver 121. The pull-up driver 122 is formed above the bonding pad 112. The pull-down driver 123 is formed on the left side of the pull-up driver 122. As shown in FIG. 2, the pull-up drivers 121 and 121 are on opposite sides of the bonding pads 111 and 112. Similarly, the pull-down drivers 123 and 124 are also on the opposite sides of the bonding pads 111 and 112. Note that the first pull-up driver and the first pull-down driver can interchange positions. The same applies to the second pull-up driver and the second pull-down driver.

The conductive line 141 branches from the pull-up signal line 131 just below the first pull-up driver 121 and enters the first pull-up driver 121 from the left side. The pull-up signal line 131 provides a pull-up voltage to the active devices 151 inside the pull-up driver 121 so that the pull-up driver 121 is driven to a high potential level. The conductive line 142 branches from the pull-up signal line 132 above the pull-up driver 122 and enters the pull-up driver 122 from the left side. The pull-down signal line 132 provides a pull-up voltage to the active devices 152 inside the pull-up driver 122 so that the pull-up driver 122 is pulled up to a high potential level. The conductive line 143 branches from the pull-down signal line 133 just below the pull-down driver 124 and enters the pull-down driver 124 from the left side. The pull-down signal line 133 provides a pull-up voltage to the active devices 154 inside the pull-down driver 124 so that the pull-down driver 124 is driven to a low potential level. The conductive line 144 branches from the pull-down signal line 134 above the pull-down driver 123 and enters the pull-down driver 123 from the right side. The pull-down signal line 134 provides a pull-down voltage to the active devices 153 inside the pull-down driver 123 so that the pull-down driver 123 is pulled down to a low potential level.

Obviously, the number of bonding pads is not restricted to just two. For an off-chip driver with more than two bonding pads, the increase in the number of pull-up drivers will be equal to the number of pull-down drivers.

Differences in layout between a conventional off-chip driver and the off-chip driver of this invention can be compared with reference to FIG. 1 and FIG. 2. A comparison between the conductive line 41 in FIG. 1 and the conductive line 141 in FIG. 2 can be made as an example here. The conductive line 141 branches from the pull-up signal line 131 below the pull-up driver 121 and enters the pull-up driver 121 directly. On the other hand, the conductive line 41 branches from the pull-up signal line 31 and runs along the side of the pull-down driver 23, the bonding pad 11 and the pull-up driver 21 before entering the pull-up driver 21. Obviously, the conductive line 141 in this invention is shorter than the conductive line 41 by the length of the pull-down driver 23, the bonding pad 11 and the pull-up driver 21.

The advantages of this invention are evident when the off-chip driver has a large number of bonding pads. Since there is no need to set aside space for accommodating running wires between neighboring bond pads, layout area can be reduced considerably. Moreover, the layout is much simpler in this invention. In addition, even when the distance of separation between the pull-up driver or the pull-down driver and the bonding pad is great, no additional layout area is needed. Furthermore, since the length of conductive lines is much shorter in this invention, signal transmission speed is also increased.

In summary, major advantages of this invention includes:

1. Considerable reduction in the layout area.
2. Simpler layout.
3. Faster signal transmission.
4. Suitable for the layout of highly integrated electronic devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A type of wiring layout for pull-up and pull-down devices of an off-chip driver, comprising:

a first bonding pad;

a second bonding pad located next to the first bonding pad;

a first pull-up driver on a lower side of the first bonding pad for providing a first pull-up voltage to the first bonding pad;

a first pull-down driver on a right side of the first pull-up driver for providing a first pull-down voltage to the first bonding pad;

a second pull-up driver on an upper side of the second bonding pad for providing a second pull-up voltage to the second bonding pad;

a second pull-down driver on a left side of the second pull-up driver for providing a second pull-down voltage to the second bonding pad;

a first pull-up signal line at a lower side of the first pull-up driver, wherein through a first pull-up conductive wire, the first pull-up signal line is connected to the first pull-up driver for providing the first pull-up voltage to active devices inside the first pull-up driver so that the first pull-up driver is pulled to a first high potential;

a first pull-down signal line at a lower side of the first pull-down driver, wherein through a first pull-down conductive wire, the first pull-down signal line is connected to the first pull-down driver for providing the first pull-down voltage to active devices inside the first pull-down driver so that the first pull-down driver is pulled to a first low potential;

a second pull-up signal line at an upper side of the second pull-up driver, wherein through a second pull-up conductive wire, the second pull-up signal line is connected to the second pull-up driver for providing the second pull-up voltage to active devices inside the second pull-up driver so that the second pull-up driver is pulled to a second high potential; and a second pull-down signal line at the upper side of the second pull-down driver, wherein through a second pull-down conductive wire, the second pull-down signal line is connected to the second pull-down driver for providing the second pull-down voltage to active devices inside the second pull-down driver so that the second pull-down driver is pulled to a second low potential.

2. The wiring layout of claim 1, wherein the positions of the first pull-up driver and the first pull-down driver can be interchanged.

3. The wiring layout of claim 1, wherein the positions of the second pull-up driver and the second pull-down driver can be interchanged.

4. The wiring layout of claim 1, wherein the active devices inside the first pull-up and pull-down drivers as well as the second pull-up and pull-down drivers include metal-oxide-semiconductor (MOS) transistors.

* * * * *